(12) United States Patent
Kusukawa et al.

(10) Patent No.: US 11,430,716 B2
(45) Date of Patent: Aug. 30, 2022

(54) POWER SEMICONDUCTOR DEVICE AND POWER CONVERSION DEVICE USING THE SAME

(71) Applicant: HITACHI AUTOMOTIVE SYSTEMS, LTD., Hitachinaka (JP)

(72) Inventors: Junpei Kusukawa, Tokyo (JP); Tadahiko Chida, Tokyo (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 303 days.

(21) Appl. No.: 16/648,611

(22) PCT Filed: Jul. 17, 2018

(86) PCT No.: PCT/JP2018/026642
§ 371 (c)(1),
(2) Date: Mar. 18, 2020

(87) PCT Pub. No.: WO2019/064831
PCT Pub. Date: Apr. 4, 2019

(65) Prior Publication Data
US 2021/0366810 A1 Nov. 25, 2021

(30) Foreign Application Priority Data
Sep. 29, 2017 (JP) .............................. JP2017-189405

(51) Int. Cl.
*H01L 23/492* (2006.01)
*H01L 23/367* (2006.01)
(Continued)

(52) U.S. Cl.
CPC .......... *H01L 23/492* (2013.01); *H01L 23/367* (2013.01); *H01L 23/49* (2013.01); *H02M 7/537* (2013.01)

(58) Field of Classification Search
CPC .......... H02M 1/32; H02M 1/327; H02M 1/44; H02M 7/003; H02M 7/537; H02M 7/5387;
(Continued)

(56) References Cited

U.S. PATENT DOCUMENTS 6,943,445 B2 * 9/2005 Shirakawa .............. H01L 24/49
257/725
10,068,880 B2 * 9/2018 Tsuyuno .................. H01L 24/40
(Continued)

FOREIGN PATENT DOCUMENTS

JP 4009056 B2 * 11/2007 ........... H01L 23/473
JP 2015-092140 A 5/2015
(Continued)

OTHER PUBLICATIONS

International Search Report, PCT/JP2018/026642, dated Sep. 11, 2018, 2 pgs.
(Continued)

*Primary Examiner* — Matthew V Nguyen
(74) *Attorney, Agent, or Firm* — Volpe Koenig

(57) ABSTRACT

An object is to suppress a decrease in reliability due to peeling of an insulating layer and another member of a power semiconductor device. A power semiconductor device according to the present invention includes: a power semiconductor element; a conductor portion that transmits a current to the power semiconductor element; an insulating layer in contact with a surface of the conductor portion on a side opposite to a side on which the power semiconductor element is arranged; a metallic heat dissipating portion that opposes the conductor portion while sandwiching the insulating layer; and an output terminal that is connected to the conductor layer and outputs a different signal depending on a contact state of the insulating portion, the insulating layer (Continued)

having an insulating portion and a conductor layer sandwiched between the conductor portion and the metallic heat dissipating portion via the insulating portion.

6 Claims, 7 Drawing Sheets

(51) Int. Cl.
*H01L 23/49* (2006.01)
*H02M 7/537* (2006.01)

(58) Field of Classification Search
CPC ....... H01L 23/36; H01L 23/367; H01L 23/49; H01L 23/492; H01L 25/072; H01L 25/18; H01L 2224/33181
See application file for complete search history.

(56) References Cited

U.S. PATENT DOCUMENTS

| | | | |
|---|---|---|---|
| 2009/0243035 A1* | 10/2009 | Mashino | H01L 24/94 257/E21.705 |
| 2011/0037166 A1 | 2/2011 | Ikeda et al. | |
| 2011/0299265 A1 | 12/2011 | Nakatsu et al. | |
| 2014/0254105 A1* | 9/2014 | Uchida | H05K 1/0263 361/720 |
| 2017/0187300 A1 | 6/2017 | Shimazu et al. | |
| 2018/0211938 A1* | 7/2018 | Tsuyuno | H01L 23/3677 |
| 2019/0221496 A1* | 7/2019 | Tsuchimochi | H01L 23/31 |
| 2020/0091042 A1* | 3/2020 | Kadoguchi | H01L 23/49575 |
| 2021/0358830 A1* | 11/2021 | Sato | H01L 23/3735 |

FOREIGN PATENT DOCUMENTS

| | | | |
|---|---|---|---|
| JP | 2015-133402 A | 7/2015 | |
| JP | 2016-39224 A | 3/2016 | |
| JP | 2016-59147 A | 4/2016 | |
| WO | WO-2014034332 A1 * | 3/2014 | ............... C23C 4/10 |

OTHER PUBLICATIONS

German Office Action dated Jun. 18, 2021 for German Patent Application No. 112018003391.0.

* cited by examiner (A) NORMAL STATE (WITHOUT PEELING)

(B) PEELING STATE ON CONDUCTOR PORTION SIDE (C) PEELING STATE ON HEAT-DISSIPATING PORTION SIDE (a) NORMAL STATE (WITHOUT PEELING)

(B) PEELING STATE ON CONDUCTOR PORTION SIDE (C) PEELING STATE ON HEAT-DISSIPATING PORTION SIDE

POWER SEMICONDUCTOR DEVICE AND POWER CONVERSION DEVICE USING THE SAME

TECHNICAL FIELD

The present invention relates to a power semiconductor device and a power conversion device using the same.

BACKGROUND ART

In recent years, global environmental gate problems and resource problems have been focused, and power conversion devices using power semiconductor elements have been widely used in fields such as consumer use, in-vehicle use, railway use, industrial use, and infrastructure use in order to effectively use resources, promote energy conservation, and suppress global warming gas emissions.

In the case of in-vehicle use, for example, there are an electric vehicle (EV) driven by a motor and a hybrid electric vehicle (HEV) combining motor driving and engine driving. In these EV and HEV, a pseudo AC voltage is created from a DC voltage of a battery by controlling switching of a power semiconductor element, and a motor is driven with high efficiency.

Since this power semiconductor element generates heat when energized, a high heat dissipation property is required. In general, a metallic heat dissipating body having a fin is used for heat dissipation of the power semiconductor element, and the power semiconductor element is connected to ground (GND) for the purpose of stabilizing a potential of the power semiconductor element and preventing an electric shock. For this reason, an insulating member is required between the power semiconductor element and the heat dissipating body, and the insulating member is required to have excellent thermal conductivity and high insulation reliability.

As means for improving a heat dissipation property, there is known a power semiconductor device having a structure in which an insulating layer is arranged between a circuit body incorporating a power semiconductor element and a heat dissipating body and heat generated by the power semiconductor element is released to a heat dissipating body via the insulating layer, for example, as illustrated in PTL 1 and PTL 2.

The power semiconductor devices described in PTL 1 and PTL 2 have thermal conductivity and an insulation property between the power semiconductor element and the heat dissipating body by arranging an insulating sheet between the circuit body incorporating the power semiconductor element and the heat dissipating body.

In the power semiconductor device described in PTL 1, a structure of the metal case member including the cooling body is devised to suppress the separation between the heat dissipating body and the circuit body.

In addition, in the power semiconductor device described in PTL 2, an intermediate conductor layer is formed in the insulating layer between a conductor portion electrically connected to the power semiconductor element of the circuit body and the heat dissipating body to divide a voltage applied between the conductor portion and the heat dissipating body the upper and lower insulating layers sandwiching the intermediate conductor layer, thereby preventing occurrence of partial discharge when the circuit body and the heat dissipating body are separated.

Problems in the power semiconductor device are separation and peeling between the conductor portion and the insulating layer, and between the insulating layer and the heat dissipating body. The peeling occurs because the power semiconductor element generates heat and the thermal expansion differs among the conductor portion that transmits a current to the power element, the heat dissipating body, and the insulating layer.

When the peeling occurs, the insulation reliability decreases due to the occurrence of partial discharge at a peeling portion and the cooling performance decreases. In the worst case, the function of the power semiconductor device is stopped.

A reduction in size and an increase in power have progressed in power semiconductor devices and power conversion devices using the same, and there is a demand for use of the power semiconductor elements at a higher temperature. In addition, SiC power semiconductor elements, which are expected to become more popular in the future, can be used in higher temperature regions as compared to Si power semiconductor elements. Thus, it is considered that the problem of peeling between the conductor portion and the insulating layer and between the insulating layer and the heat dissipating body becomes serious.

CITATION LIST

Patent Literature

PTL 1: JP 2016-39224 A
PTL 2: JP 2016-59147 A

SUMMARY OF INVENTION

Technical Problem

Therefore, an object of the present invention is to suppress a decrease in reliability due to peeling between an insulating layer and other members.

Solution to Problem

A power semiconductor device according to the present invention includes: a power semiconductor element; a conductor portion that transmits a current to the power semiconductor element; an insulating layer in contact with a surface of the conductor portion on a side opposite to a side on which the power semiconductor element is arranged; a metallic heat dissipating portion that opposes the conductor portion while sandwiching the insulating layer; and an output terminal that is connected to the conductor layer and outputs a different signal depending on a contact state of the insulating portion, the insulating layer having an insulating portion and a conductor layer sandwiched between the conductor portion and the metallic heat dissipating portion via the insulating portion.

Advantageous Effects of Invention

According to the present invention, it is possible to suppress the decrease in reliability of a power semiconductor device and a power conversion device using the same.

DESCRIPTION OF EMBODIMENTS

Embodiments according to the present invention will be described below based on examples.

Figure 1:
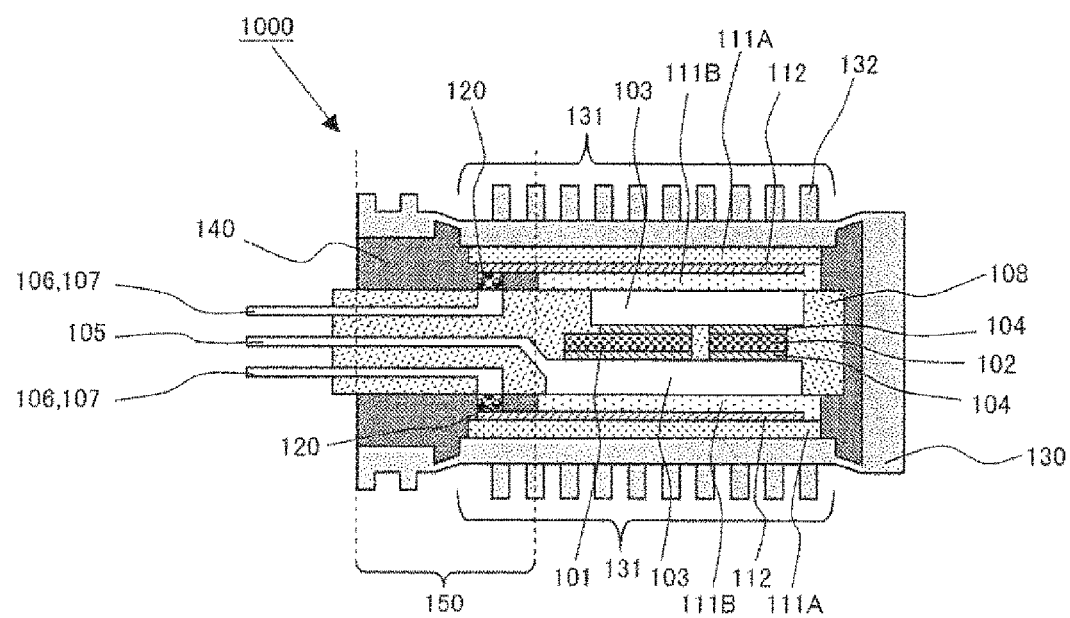
FIG. 1 is a cross-sectional view of a power semiconductor device 1000 according to the present embodiment.

FIG. 1 is a cross-sectional view of a power semiconductor device 1000 according to the present embodiment.

The power semiconductor device 1000 includes: power semiconductor elements 101 and 102; a conductor portion 103 that transmits a current to the power semiconductor elements 101 and 102; insulating layers 111A and 111B in contact with a surface of the conductor portion 103 on the side opposite to the side where the power semiconductor elements 101 and 102 are arranged; and a metallic heat dissipating portion 131 that opposes the conductor portion 103 so as to sandwich the insulating layers 111A and 111B. In the present embodiment, the power semiconductor element 101 is an IGBT and the power semiconductor element 102 is a diode.

A conductor layer 112 is provided between the insulating layer 111A and the insulating layer 111B. An output terminal 107 is connected to the conductor layer 112 and outputs different signals depending on a contact state between the insulating layer 111A or the insulating layer 111B and other members.

Figure 2:
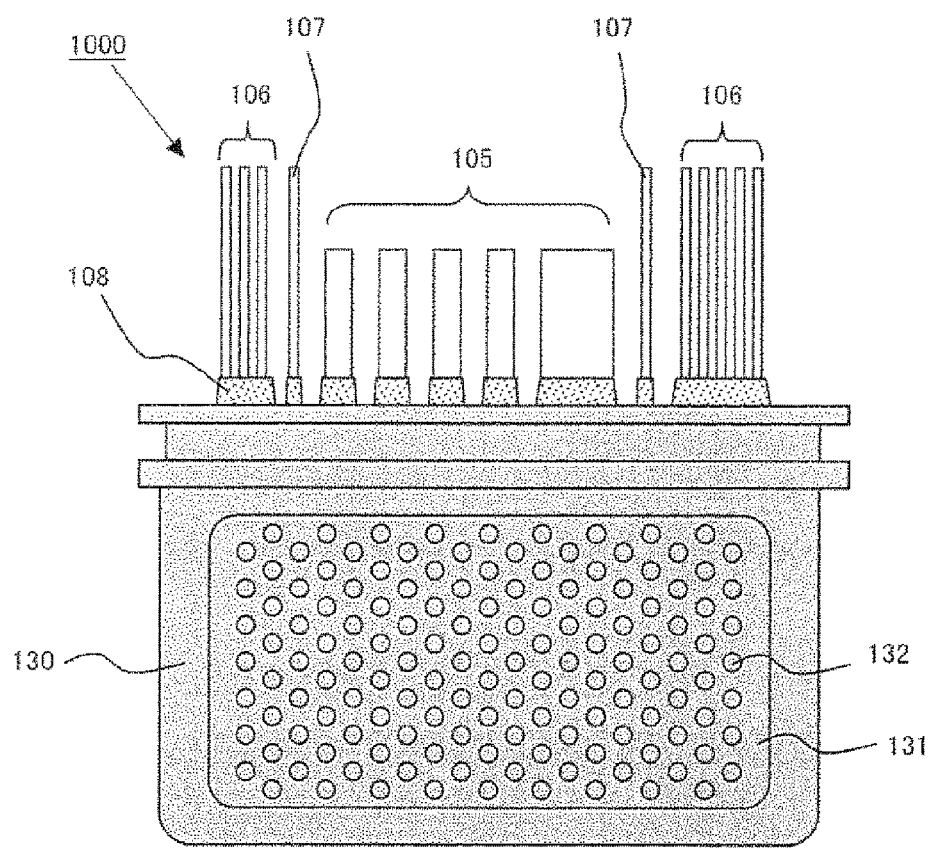
FIG. 2 is a plan view of the power semiconductor device 1000 according to the present embodiment.
Figure 3:
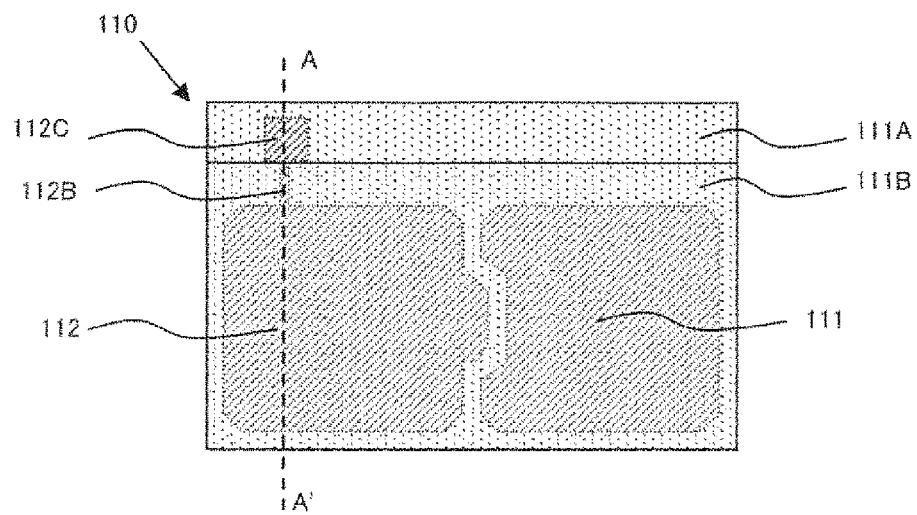
FIG. 3 is a plan perspective view of an insulating portion 110 constituted by an insulating layer 111A and the like according to the present embodiment.
Figure 4:
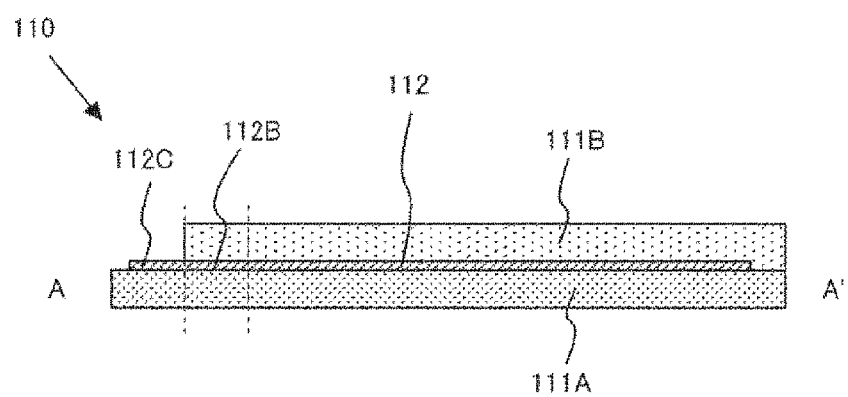
FIG. 4 is a cross-sectional view of an insulating portion 110 cut along a plane AA in FIG. 3.
Figure 5:
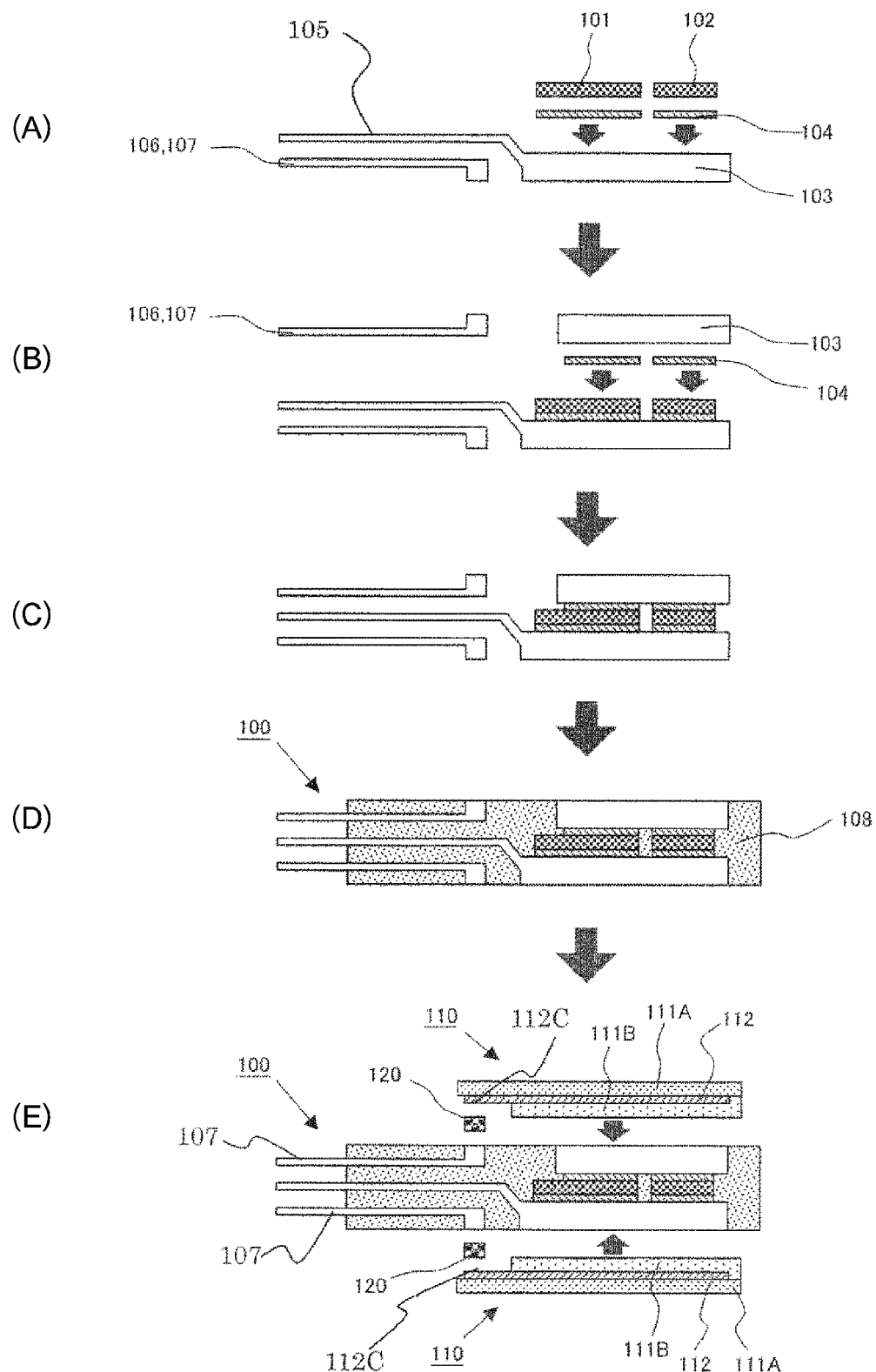
FIG. 5 is a cross-sectional view illustrating a manufacturing process of a circuit body 100 according to the present embodiment.

FIG. 2 is a plan view of the power semiconductor device 1000 according to the present embodiment. FIG. 4 is a plan perspective view of an insulating portion 110 constituted by the insulating layer 111A and the like according to the present embodiment. FIG. 5 is a cross-sectional view of the insulating portion 110 cut along a plane AA of FIG. 4.

The insulating portion 110 is constituted by the insulating layer 111A on the side in contact with the metallic heat dissipating portion 131, the insulating layer 111B on the side in contact with the conductor portion 103, and the conductor layer 112 sandwiched between the insulating layer 111A and the insulating layer 111B. In addition, the insulating portion 110 includes a connection electrode 112C that is electrically connected to the output terminal 107, and a routing wiring 112B that is connected from the conductor layer 103 to the connection electrode 112C.

A manufacturing process of a circuit body 100 according to the present embodiment will be described with reference to FIGS. 5(A) to 5(E).

In FIG. 5(A), the power semiconductor elements 101 and 102 are bonded onto the conductor portion 103 via a bonding material 104. Here, metal having high conductivity such as copper and aluminum is generally used for the conductor portion 103, and solder or the like is used for the bonding material 104.

In addition, a power terminal 105 extending from the conductor portion 103 is provided in FIG. 5(A). The conductor portion 103 and the power terminal 105 may be formed to be integrated, or may be separate members and connected to each other with a bonding material. After bonding the power semiconductor element 101 onto the conductor portion 103, a gate electrode on the power semiconductor element 101 and a control terminal 106 are connected with a thin metal wire (the thin metal wire is not illustrated for simplicity of the drawing).

In FIG. 5(B), the other surfaces of the power semiconductor elements 101 and 102 are similarly bonded to the conductor portion 103 via the bonding material 104 to obtain a state as illustrated in FIG. 5(C).

In FIG. 5(D), the power semiconductor elements 101 and 102 and the conductor portion 103 are sealed with a mold resin 108. If necessary, the mold resin 108 is polished so as to expose a surface of the conductor portion 103 on the side opposite to the side where the power semiconductor elements are arranged.

Further, in FIG. 5(E), a conductive adhesive member 120 is arranged between the output terminal 107 exposed on the surface of the circuit body 100 and the connection electrode 112C to electrically connect the output terminal 107 and the connection electrode 112C.

Here, as the conductive adhesive member 120, a conductive adhesive in which metal particles are dispersed in a resin, an anisotropic conductive paste, an anisotropic conductive film, or the like can be used.

In this step, the circuit body 100 and the insulating portion 110 are fixed, and the conductor layer 112 and the output terminal 107 are electrically connected.

A manufacturing process of the power semiconductor device 1000 according to the present embodiment will be described with reference to FIGS. 6(A) to 6(D).

Figure 6:
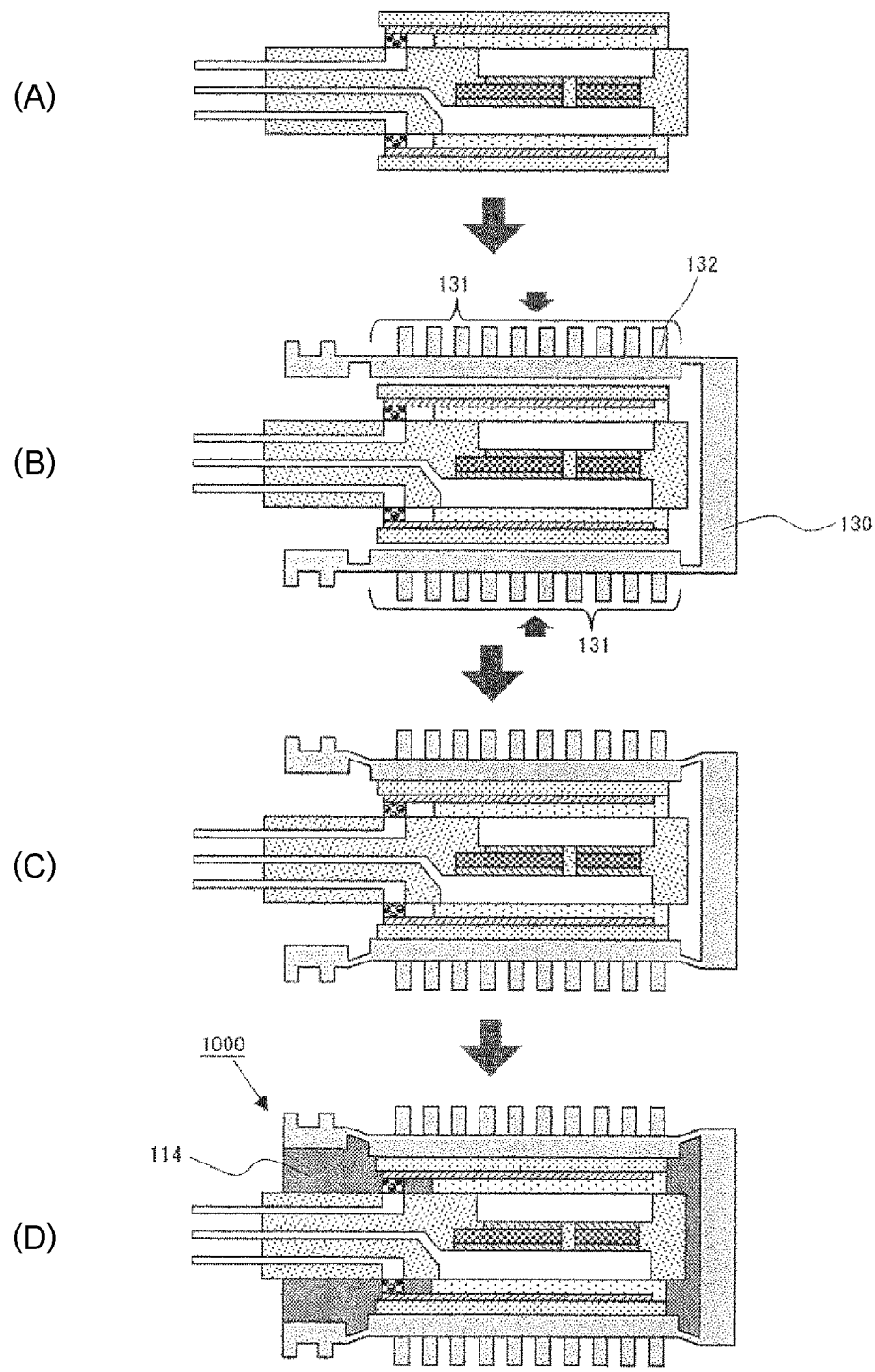
FIG. 6 is a cross-sectional view illustrating a manufacturing process of the power semiconductor device 1000 according to the present embodiment.

In FIG. 6(B), the circuit body 100 integrated with the insulating portion 110 is inserted into a case 130 having a metallic heat dissipating portion 131 and heat dissipating fins 132.

Then, in FIG. 6(C), the metallic heat dissipating portion 131 is pressed with a vacuum press machine to deform a thin portion of the case 130 and perform bonding between an inner surface of the metallic heat dissipating portion 131 and the insulating portion 110 and bonding between the insulating layer and the circuit body 100.

Then, in FIG. 6(D), a potting resin 140 is injected into a space against the circuit body 110 inside the case 130, and the potting resin 140 is cured at a predetermined temperature for a predetermined time, whereby the power semiconductor device 1000 is completed.

Next, a method for diagnosing a peeling state between the conductor portion 103 and the insulating portion 110 and a peeling state between the insulating portion 110 and the metallic heat dissipating portion 131 of the power semiconductor device 1000 according to the present embodiment will be described. (Inspection after Completion of Power Semiconductor Device)

Figure 7:
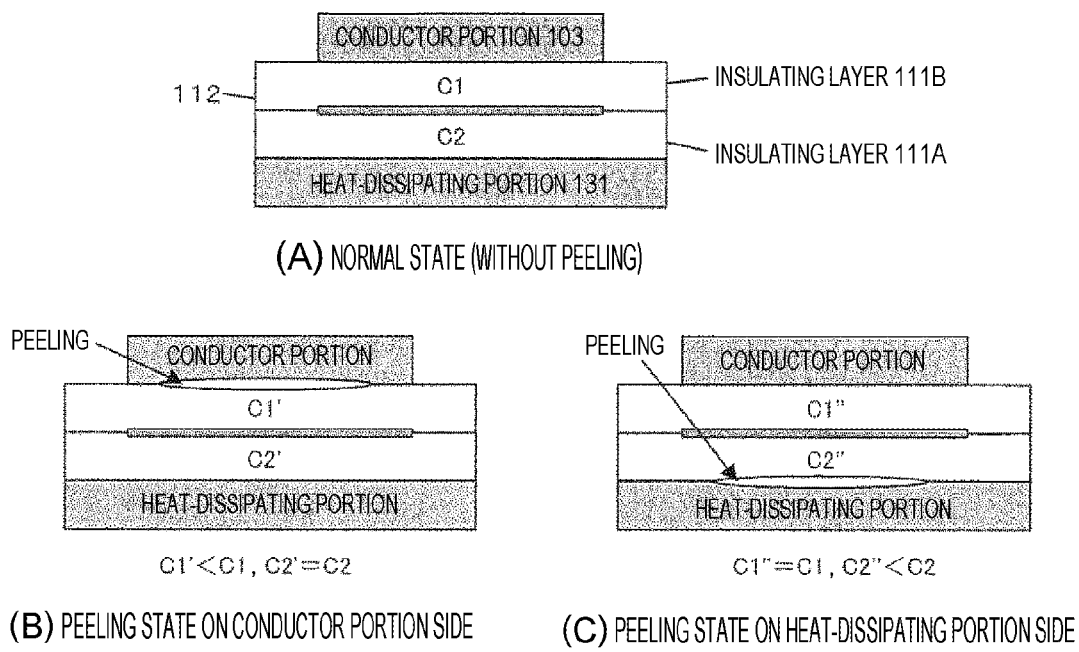
FIG. 7 is a cross-sectional view for describing a principle of evaluating and diagnosing a contact state and a peeling state of the insulating portion 110 with respect to a conductor portion and a heat dissipating portion in capacitance measurement using an output terminal 107 of the power semiconductor device 1000 according to the present embodiment.

FIG. 7 is a cross-sectional view for describing a principle of evaluating and diagnosing a contact state and a peeling state of the insulating portion 110 with respect to the conductor portion and the heat dissipating portion in capacitance measurement using the output terminal 107 of the power semiconductor device 1000 according to the present embodiment.

In FIG. 7(A), a capacitance of the insulating layer 111B on the conductor portion 103 side in a normal state where there is no peeling between the conductor portion 103 and the insulating layer 111B and between the insulating layer 111A and the metallic heat dissipating portion 131 is set as C1, and a capacitance of the insulating layer 111A on the metallic heat dissipating portion 131 side is set as C2. If the insulating layer 111A and the insulating layer 111B are formed so as to have the same material (relative dielectric constant) and thickness, C1 and C2 are values which are substantially the same.

FIG. 7(B) illustrates a state where there is peeling between the conductor portion 103 and the insulating layer 111B. If there is peeling between the conductor portion 103 and the insulating layer 111B, a distance between the conductor portion 103 and the conductor layer 112 increases and an air layer (relative dielectric constant is one) is added to the insulating portion, and thus, a capacitance C1' on the conductor portion 103 side is smaller than the capacitance C1 in the normal state without peeling.

FIG. 7(C) illustrates a state where there is peeling between the insulating layer 111A and the metallic heat dissipating portion 131. In this case, the distance between the conductor layer 112 and the metallic heat dissipating portion 131 increases and the air layer (relative dielectric constant is one) is added to the insulating portion, and thus, a capacitance C2' on the metallic heat dissipating portion 131 side is smaller than the capacitance C2 in the normal state without peeling.

Figure 8:
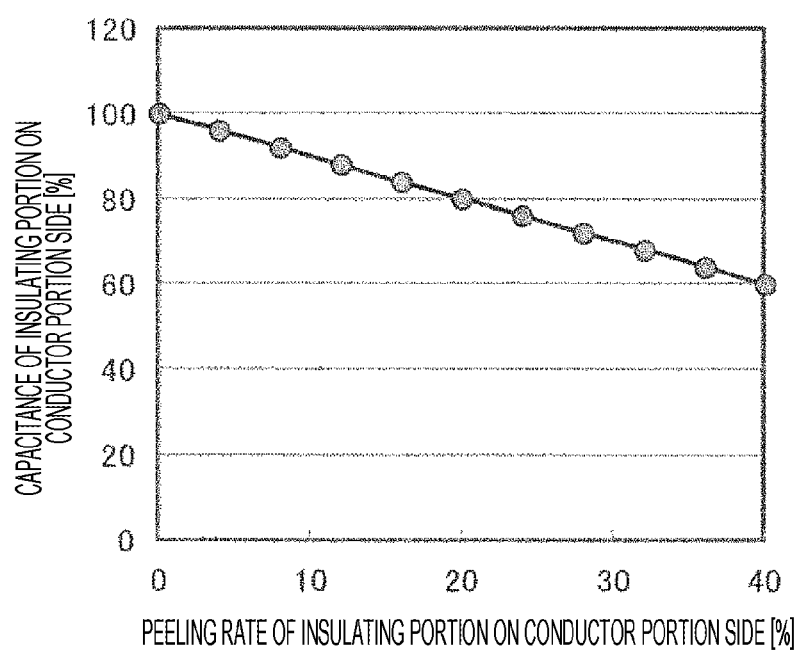
FIG. 8 is a graph illustrating a relationship between a contact states (peeling rate) between the conductor portion 103 and an insulating layer and a capacitance of an insulating layer 111B on the conductor portion side.

FIG. 8 is a graph illustrating a relationship between the contact state (a peeling rate) between the conductor portion 103 and the insulating layer and a capacitance of the insulating layer 111B on the conductor portion side.

Here, the peeling rate is a numerical value represented by a ratio of the area of a peeled portion between the conductor portion 103 and the insulating layer 111B with reference to the area of a surface where the conductor portion 103 and the conductor layer 112 oppose each other in the normal state where there is no peeling between the conductor portion 103 and the insulating layer 111B.

As can be understood from FIG. 8, if there is peeling between the conductor portion 103 and the insulating layer 111B, the capacitance of the insulating portion on the conductor portion side decreases depending on the peeling area and the peeling rate thereof.

Although FIG. 8 is the graph illustrating a change in capacitance when the conductor portion 103 and the insulating layer 111B are peeled off, the capacitance of the insulating portion on the heat dissipating portion side similarly decreases if there is peeling between the metallic heat dissipating portion 131 and the insulating layer 111A.

When a capacitance between the power terminal 105 and the output terminal 107 and a capacitance between the metallic heat dissipating portion 131 and the output terminal 107 are measured using a measuring instrument such as an LCR meter and an impedance analyzer after completion of the power semiconductor device 1000 based on the above-described principle, it is possible to inspect and diagnose the contact state between the conductor portion 103 and the insulating layer 111B and the contact state between the insulating layer 111A and the metallic heat dissipating portion 131.

(Diagnosis During Operation of Power Conversion Device and Use of Diagnosis Result)

Figure 9:
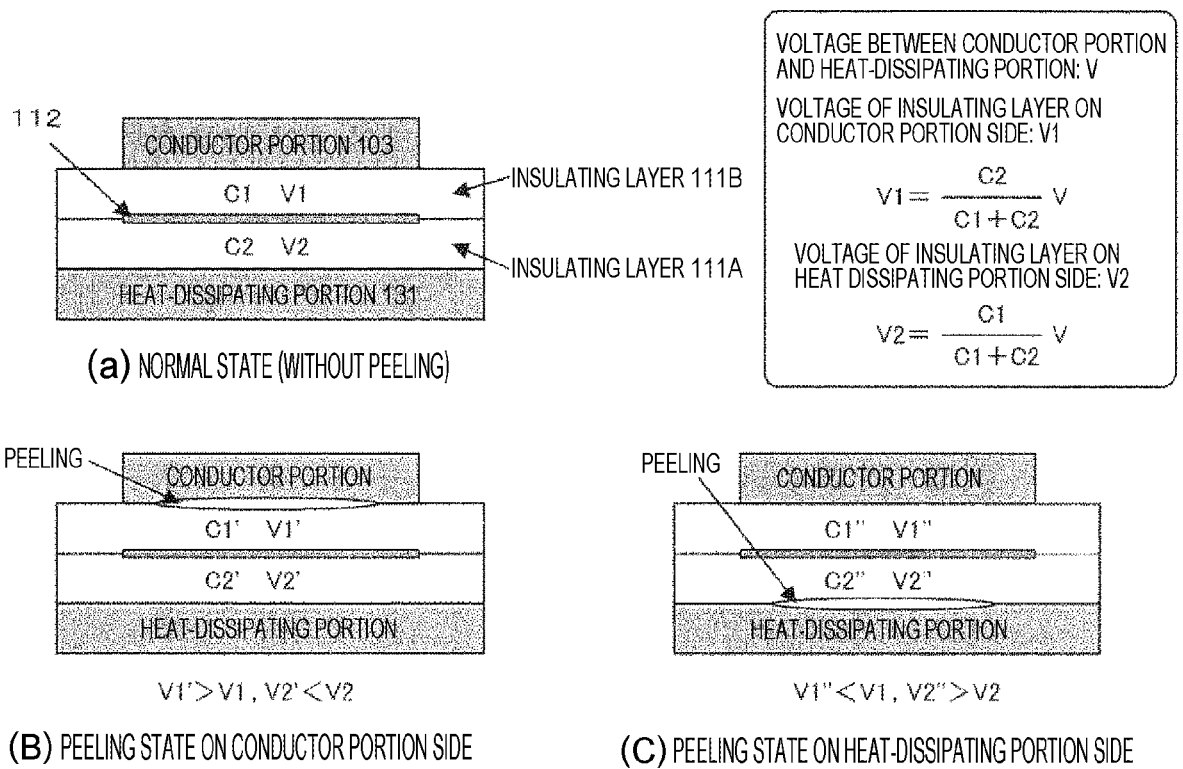
FIG. 9 is a cross-sectional view for describing a principle of evaluating and diagnosing the contact state of the insulating layer with respect to the conductor portion and the heat dissipating portion in voltage measurement using the output terminal 107 of the power semiconductor device 1000 according to the present embodiment.

FIG. 9 is a cross-sectional view for describing a principle of evaluating and diagnosing the contact state of the insulating layer with respect to the conductor portion and the heat dissipating portion in voltage measurement using the output terminal 107 of the power semiconductor device 1000 according to the present embodiment.

In FIG. 9(A), a capacitance of the insulating layer 111B on the conductor portion 103 side in a normal state where there is no peeling between the conductor portion 103 and the insulating layer 111B and between the insulating layer 111B and the metallic heat dissipating portion 131 is set as C1, and a capacitance of the insulating layer 111A on the metallic heat dissipating portion 131 side is set as C2.

If the insulating portion on the conductor portion 103 side and the insulating portion on the metallic heat dissipating portion 131 side are formed so as to have the same insulating layer material (relative dielectric constant) and thickness, C1 and C2 are values which are substantially the same. Therefore, a voltage of the conductor layer 112 in the normal state without peeling is substantially half a voltage imposed between the conductor portion 103 and the metallic heat dissipating portion 131, and a voltage V1 of the insulating layer 111B on the conductor portion 103 side and a voltage V2 of the insulating layer 111A on the metallic heat dissipating portion 131 side are values which are substantially the same.

FIG. 9(B) illustrates a state where there is peeling between the conductor portion and the insulating layer. If there is peeling between the conductor portion and the insulating layer, a distance between the conductor portion and the conductor layer increases and an air layer (relative dielectric constant is one) is added to the insulating portion, and thus, a capacitance C1' on the conductor portion side is smaller than the capacitance C1 in the normal state without separation. As a result, a voltage V1' applied to the insulating portion on the conductor portion side increases, and a voltage V2' applied to the insulating portion on the heat dissipating portion side decreases.

FIG. 9(C) illustrates a state where there is peeling between the insulating layer and the heat dissipating portion. In this case, the distance between the conductor layer and the heat dissipating portion increases and the air layer (relative dielectric constant is one) is added to the insulating portion, and thus, a capacitance C2" on the heat dissipating portion side is smaller than the capacitance C2 in the normal state without peeling. As a result, the voltage V1' applied to the insulating portion on the conductor portion side decreases, and the voltage V2' applied to the insulating portion on the heat dissipating portion side increases.

Figure 10:
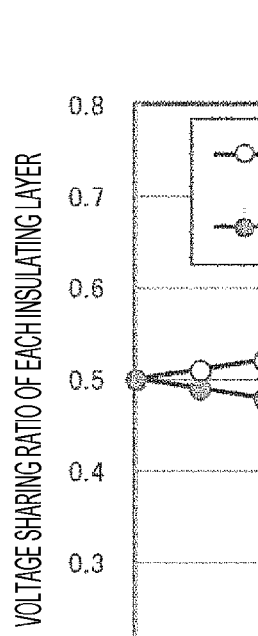
FIG. 10 is a graph illustrating voltage sharing of an insulating portion on the conductor portion side and an insulating portion on the heat dissipating portion side when the conductor portion and the insulating layer are peeled off from each other.

FIG. 10 is a graph illustrating a relationship in which a ratio between voltage sharing of the insulating portion on the conductor portion side and voltage sharing of the insulating portion on the heat dissipating portion side changes depending on the contact state (a peeling rate) between the conductor portion and the insulating layer. Here, the peeling rate is a numerical value represented by a ratio of the area of a peeled portion between the conductor portion and the insulating layer with reference to the area of a surface where the conductor portion and the conductor layer oppose each other in the normal state where there is no peeling between the conductor portion and the insulating layer. As can be understood from FIG. 11, if there is peeling between the conductor portion and the insulating layer, the voltage sharing of the insulating portion on the conductor portion side increases depending on the peeling rate thereof, and the voltage sharing of the insulating portion on the heat dissipating portion side decreases.

Although FIG. 10 is the graph illustrating the voltage sharing of each of the insulating portion on the conductor portion side and the insulating portion on the heat dissipating portion side when the conductor portion and the insulating layer are peeled off, the voltage sharing of the insulating portion on the conductor portion side decreases and the voltage sharing of the insulating portion on the heat dissipating portion side increases if the heat dissipating portion and the insulating layer are peeled off from each other.

Figure 11:
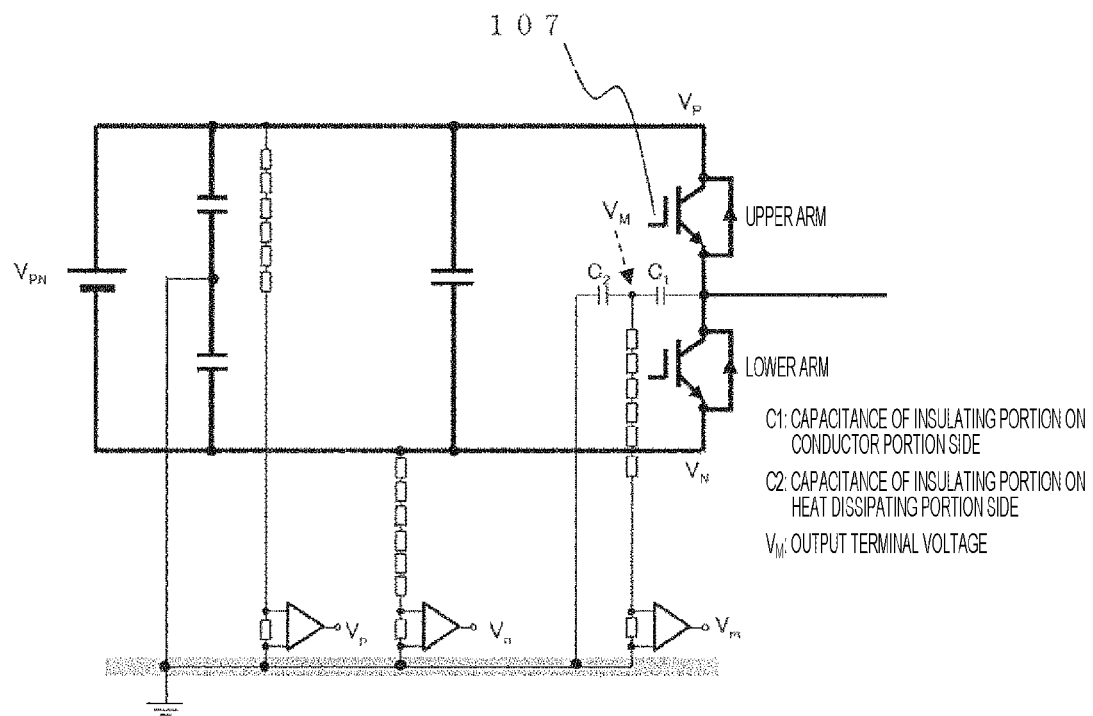
FIG. 11 is a circuit diagram illustrating a circuit configuration configured to detect a voltage in the voltage measurement using the output terminal 107 of the power semiconductor device 1000 according to the present embodiment.

FIG. 11 is a circuit diagram illustrating a circuit configuration configured to detect a voltage in the voltage measurement using the output terminal 107 of the power semiconductor device 1000 according to the present embodiment.

Figure 12:
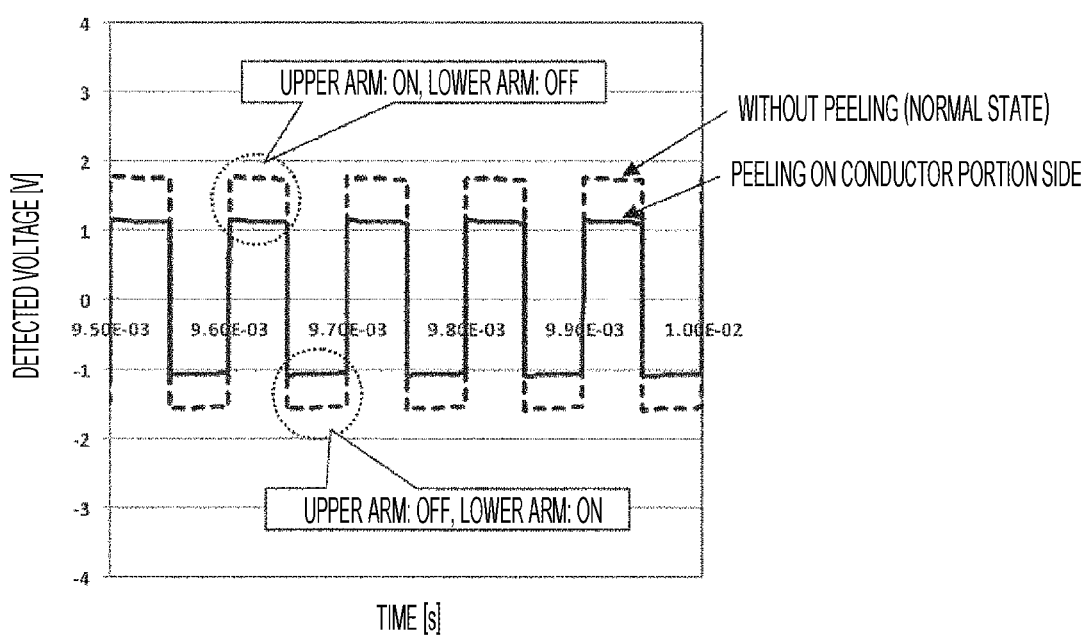
FIG. 12 illustrates a result obtained by monitoring the voltage at the output terminal 107 of the power semiconductor device 1000 using a voltage detection circuit.

In a power conversion device using the power semiconductor device 1000 according to the present embodiment, a voltage detection circuit as illustrated in FIG. 12 is formed. In FIG. 12, a circuit portion indicated by a thick line is the main circuit of the power conversion device, and a circuit portion indicated by a thin line is the voltage detection circuit.

A voltage of the output terminal 107 of the power semiconductor device 1000 according to the present embodiment is a high voltage, which is about half a voltage of the main circuit, and thus, is output as a voltage value obtained by A/D conversion as a voltage VM divided by a resistor.

FIG. 12 illustrates a result obtained by monitoring the voltage at the output terminal 107 of the power semiconductor device 1000 using the voltage detection circuit.

A voltage change of the output terminal in the normal state where there is no peeling between the conductor portion and the insulating layer and between the insulating layer and the heat dissipating portion is indicated by a broken line, and a voltage change of the output terminal when there is peeling between the conductor and the insulating layer is indicated by a broken line. The voltage at the output terminal changes with time depending on the switching of the power semiconductor element. For this reason, it is necessary to detect the voltage in synchronization with the switching in order to accurately diagnose the peeling state between the conductor portion and the insulating layer and the peeling state between the insulating layer and the heat dissipating portion. For example, each voltage when switching is ON and when OFF is detected in synchronization with a signal of a drive circuit, a difference between the respective voltage values is adopted, and the peeling state can be diagnosed based on a change of the voltage of the difference from the initial normal state.

Incidentally, potentials when a switching state of the power semiconductor element is a conduction state and a cutoff state may be detected based on a signal from the output terminal 107, and a switching frequency of the power semiconductor element may be lowered when a potential difference between the conduction state and the cutoff state reaches a predetermined threshold.

In addition, an input voltage between a positive terminal and a negative terminal of the power semiconductor device may be lowered when the potential difference between the above-described conduction state and the above-described cutoff state reaches a predetermined threshold.

An output of the power semiconductor device may be lowered when the potential difference between the above-described conduction state and the above-described cutoff state reaches a predetermined threshold.

A signal to warn a driver may be output when the potential difference between the above-described conduction state and the above-described cutoff state reaches a predetermined threshold.

With the power semiconductor device according to the present embodiment, it is possible to diagnose the peeling state between the conductor portion that transmits the current to the power semiconductor element and the insulating layer and the peeling state between the insulating layer and the metallic heat dissipating portion, and it is possible to detect an abnormality before the function of the power semiconductor device stops. In addition, since the diagnosis of the peeling state and abnormality detection are possible, an abrupt failure of the power conversion device can be prevented in advance, and further, it is possible to extend an operation time until the function stops by suppressing the output of the power semiconductor device and the power conversion device after detecting the abnormality. As a result, the reliability of the power semiconductor device and the power conversion device can be improved.

REFERENCE SIGNS LIST 100 circuit body
101 power semiconductor element
102 power semiconductor element
103 conductor portion
104 bonding material
105 power terminal
106 control terminal
107 output terminal
108 mold resin
110 insulating portion
111A insulating layer
111B insulating layer
112 conductor layer
112C connection electrode
120 conductive adhesive member
130 case
131 metallic heat dissipating portion
132 heat dissipating fin
140 potting resin
1000 power semiconductor device

The invention claimed is:
1. A power semiconductor device comprising:
a power semiconductor element;
a conductor portion that transmits a current to the power semiconductor element;

an insulating layer in contact with a surface of the conductor portion on a side opposite to a side on which the power semiconductor element is arranged;

a metallic heat dissipating portion that opposes the conductor portion while sandwiching the insulating layer; and an output terminal that is connected to a conductor layer and outputs a different signal depending on a contact state of an insulating portion, wherein the insulating layer has the insulating portion and the conductor layer sandwiched between the conductor portion and the metallic heat dissipating portion via the insulating portion.

2. A power conversion device using the power semiconductor device according to claim 1, the power conversion device comprising:

a diagnostic unit that diagnoses the contact state of the insulating portion by comparing an initial value and a value obtained by detecting a potential difference between a conduction state and a cutoff state during an operation of the power conversion device after a lapse of a predetermined time, the initial value being set using a potential difference when use of the power conversion device is started based on the potential difference between the conduction state and the cutoff state, wherein potentials when a switching state of the power semiconductor element is in the conduction state and the cutoff state are detected based on a signal from the output terminal.

3. A power conversion device using the power semiconductor device according to claim 1, wherein potentials when a switching state of the power semiconductor element is in a conduction state and a cutoff state are detected based on a signal from the output terminal, and a switching frequency of the power semiconductor element is lowered when a potential difference between the conduction state and the cutoff state reaches a predetermined threshold.

4. A power conversion device using the power semiconductor device according to claim 1, wherein potentials when a switching state of the power semiconductor element is in a conduction state and a cutoff state are detected based on a signal from the output terminal, and an input voltage between a positive terminal and a negative terminal of the power semiconductor device is lowered when a potential difference between the conduction state and the cutoff state reaches a predetermined threshold.

5. A power conversion device using the power semiconductor device according to claim 1, wherein potentials when a switching state of the power semiconductor element is in a conduction state and a cutoff state are detected based on a signal from the output terminal, and an output of the power semiconductor device is lowered when a potential difference between the conduction state and the cutoff state reaches a predetermined threshold.

6. A power conversion device using the power semiconductor device according to claim 1, wherein potentials when a switching state of the power semiconductor element is in a conduction state and a cutoff state are detected based on a signal from the output terminal, and a signal to warn a driver is output when a potential difference between the conduction state and the cutoff state reaches a predetermined threshold.

* * * * *